United States Patent
Shi et al.

(10) Patent No.: US 10,229,937 B2
(45) Date of Patent: Mar. 12, 2019

(54) ARRAY STRUCTURE, MANUFACTURING METHOD THEREOF, ARRAY SUBSTRATE AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Dawei Shi, Beijing (CN); Xinyou Ji, Beijing (CN); Fuqiang Li, Beijing (CN); Jian Guo, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 165 days.

(21) Appl. No.: 14/409,316

(22) PCT Filed: Jun. 20, 2014

(86) PCT No.: PCT/CN2014/080453
§ 371 (c)(1),
(2) Date: Dec. 18, 2014

(87) PCT Pub. No.: WO2015/070610
PCT Pub. Date: May 21, 2015

(65) Prior Publication Data
US 2016/0276367 A1    Sep. 22, 2016

(30) Foreign Application Priority Data
Nov. 15, 2013  (CN) .......................... 2013 1 0571411

(51) Int. Cl.
*H01L 27/12*    (2006.01)
*G02F 1/1362*   (2006.01)
(Continued)

(52) U.S. Cl.
CPC .......... *H01L 27/124* (2013.01); *G02F 1/1368* (2013.01); *G02F 1/13458* (2013.01);
(Continued)

(58) Field of Classification Search
CPC ............... H01L 27/124; H01L 27/1259; G02F 1/136227; G02F 1/1368
(Continued)

(56) References Cited

U.S. PATENT DOCUMENTS 6,767,754 B2    7/2004  Takizawa et al.
6,890,856 B2 *  5/2005  Kim ................. G02F 1/136227
                                                   438/689
(Continued)

FOREIGN PATENT DOCUMENTS

| CN | 101393364 A | 3/2009 |
|----|-------------|--------|
| CN | 101621039 A | 1/2010 |
| CN | 103560113 A | 2/2014 |

OTHER PUBLICATIONS

May 17, 2016—International Preliminary Report on Patentability Appn PCT/CN2014/080453.
(Continued)

*Primary Examiner* — Ori Nadav
(74) *Attorney, Agent, or Firm* — Banner & Witcoff, Ltd.

(57) ABSTRACT

An array structure and a manufacturing method thereof are disclosed. The method for manufacturing the array structure includes: forming a gate insulating layer on a glass substrate; and etching the gate insulating layer at a position corresponding to a source/drain signal access terminal, and forming a through-hole structure provided with an outward-inclined side wall in the gate insulating layer. Conductive films in the source/drain signal access terminal and a gate signal access terminal which have wires thereof alternate with each other have a same height, so that the forces applied
(Continued)

to conductive balls can be more uniform, and hence the conductivity can be improved.

7 Claims, 5 Drawing Sheets

(51) Int. Cl.
    *G02F 1/1368*     (2006.01)
    *G02F 1/1345*     (2006.01)

(52) U.S. Cl.
    CPC .... *G02F 1/136227* (2013.01); *H01L 27/1259* (2013.01); *H01L 2224/10* (2013.01)

(58) Field of Classification Search
    USPC .......................................................... 257/72
    See application file for complete search history.

(56) References Cited

U.S. PATENT DOCUMENTS

| | | | |
|---|---|---|---|
| 7,372,513 B2* | 5/2008 | Choi | G02F 1/136204 349/147 |
| 2003/0124849 A1* | 7/2003 | Ihara | B81C 1/00547 438/689 |
| 2006/0180569 A1 | 8/2006 | Hsi-Ming | |
| 2011/0127532 A1 | 6/2011 | Ahn et al. | |

OTHER PUBLICATIONS

Nov. 3, 2015—(CN) Second Office Action Appn 201310571411.1 with English Tran.
International Search Report dated Sep. 19, 2014 (PCT/CN2014/080453); ISA/CN.
Jul. 2, 2015—(CN) First Office Action for Appn 201310571411.1 with Eng Tran.

* cited by examiner

US 10,229,937 B2

ARRAY STRUCTURE, MANUFACTURING METHOD THEREOF, ARRAY SUBSTRATE AND DISPLAY DEVICE

The application is a U.S. National Phase Entry of International Application PCT/CN2014/080453 filed on Jun. 20, 2014, designating the United States of America and claiming priority to Chinese Patent Application No. 201310571411.1, filed on Nov. 15, 2013. The present application claims priority to and the benefit of the above-identified applications and the above-identified applications are incorporated by reference herein in their entirety.

TECHNICAL FIELD

The present disclosure relates to the field of display technology, and in particular to an array structure, a manufacturing method thereof, an array substrate based on the array structure, and a display device.

BACKGROUND

Currently, with the continuous improvement of the resolution of liquid crystal display panels, particularly as for liquid crystal display panels of small dimension, the improvement of the resolution means the increase of the quantity of pixels in unit length, namely PPI (pixels per inch), and hence the quantity of leading wires within the same space increases accordingly.

It is known to the inventor that, generally, the space for wiring is reduced as much as possible by adoption of alternate wiring for an IC (integrated circuit) to solve the problem of more and more IC pins. FIG. 1 is a schematic view illustrating a gate layer and a source/drain (SD) metal layer which have wires thereof alternate with each other, 01 represents the gate layer and 02 represents the SD metal layer. The alternate wiring is performed through the gate layer and the SD metal layer, then through holes are formed in the gate layer and the SD metal layer by an exposing and etching process and finally wires are led out by an ITO (indium tin oxide) layer. The left side and the right side of FIG. 2 are respectively sectional views of the gate layer and the SD metal layer which have wires thereof alternate with each other. In FIG. 2 a gate signal access terminal includes a gate electrode 01, a gate insulating (GI) layer (03), a passivation (PVX) layer 04 and a conductive film 05 (e.g., an ITO layer) which are formed on a substrate 00 in sequence. An SD signal access terminal includes the GI layer 03, an SD metal layer 02, the PVX layer 04 and the conductive film 05 which are formed on the substrate 00 in sequence. As the gate signal access terminal (pad) and the SD signal access terminal have different structures, the finally formed signal access terminals have different heights, and hence poor contact between IC bonding pads and IC pins can be caused. As illustrated in FIG. 3, the height of the conductive film 05 in the SD signal access terminal is greater than that of the conductive film 05 in the gate signal access terminal. Height difference occurs between the conductive films 05 in the IC bonding pads corresponding to adjacent IC pins 07, and hence the contact areas between conductive balls 07 and the conductive films 05 in adjacent IC bonding pads are different and the applied forces are nonuniform. Thus, poor welding state can be caused and the conductivity can be reduced.

SUMMARY

The present disclosure provides a method for manufacturing an array structure, which method, before forming an SD metal layer on a GI layer, further includes: etching the GI layer at a position corresponding to an SD signal access terminal, and forming a through-hole structure in the GI layer.

Moreover, after etching the GI layer at the position corresponding to the SD signal access terminal, the method further includes: forming the SD metal layer, a PVX layer and a conductive film in sequence on the GI layer provided with the through-hole structure.

Furthermore, after forming the SD metal layer, the method further includes: performing a same etching to the SD metal layer at a position corresponding to the through-hole structure as the etching of forming the through-hole structure, forming the PVX layer on the SD metal layer continuously, performing a same etching as well, and finally forming the conductive film.

In order to solve the above-mentioned technical problem, the present disclosure further provides an array structure, which is manufactured by the above-mentioned method for manufacturing an array structure.

In order to solve the above-mentioned technical problem, the present disclosure further provides a display device, which includes an array substrate and a color filter substrate, and the array substrate is obtained by forming the above-mentioned array structure on a glass substrate.

In order to solve the above-mentioned technical problem, the present disclosure further provides a method for manufacturing an array structure, which method, after forming an SD metal layer on a GI layer, further includes: forming a through-hole structure in the SD metal layer to which a position where the SD signal access terminal is located corresponds. Gradual slopes are formed on both sides of the through-hole structure.

Moreover, the through-hole structure includes a main hole and compensation holes formed on both sides of the main hole. The compensation holes are smaller than the main hole. In addition, the main hole is fully-transparent and the compensation holes are not fully-transparent.

Moreover, the through-hole structure includes a main hole and half-transparent films formed on both sides of the main hole. The main hole is fully-transparent and the half-transparent films are not fully-transparent.

Moreover, the half-transparent films include a plurality of second half-transparent films with different transmittances; and the transmittances of the second half-transparent films are progressively decreased from the main hole as a start to the both sides.

Moreover, the through-hole structure provided with the main hole and the compensation holes or with the main hole and the half-transparent films is formed in the SD metal layer by a wet etching. Subsequently, a layer of photoresist with a slope is formed on the SD metal layer. The height of the photoresist is gradually reduced from the both sides to the main hole. The photoresist is subjected to an exposure and the SD metal layer is subjected to a dry etching.

Furthermore, after performing the dry etching to the SD metal layer, the method further includes: forming a PVX layer on the SD metal layer, performing a same slope etching to the PVX layer at a position corresponding to the through-hole structure, and finally forming a conductive film.

In order to solve the technical problem, the present disclosure further provides an array structure, which is manufactured by the above-mentioned method for manufacturing an array structure.

In order to solve the technical problem, the present disclosure further provides a display device, which includes an array substrate and a color filter substrate, and the array substrate is obtained by forming the array structure on a glass substrate.

Embodiments of the present disclosure provide an array structure, a manufacturing method thereof, an array substrate based on the array structure, and a display device, and before forming an SD metal layer on a GI layer, the method for manufacturing an array structure further includes: etching the GI layer at a position corresponding to an SD signal access terminal, and forming a through-hole structure in the GI layer; or after forming an SD metal layer on a GI layer, the method further includes forming a through-hole structure in the SD metal layer at a position corresponding to an SD signal access terminal, and in the method, gradual slopes are formed on both sides of the through-hole structure. The GI layer beneath the SD metal layer is etched, so that the height of the conductive film on the SD metal layer can be reduced. Or the SD metal layer is etched to form the through-hole structure provided with the gradual slopes on both sides thereof, so that the ITO layers in the SD signal access terminal and the gate signal access terminal in an alternate-wiring mode have same height, and hence the forces applied to conductive balls are more uniform and the conductivity is improved.

DETAILED DESCRIPTION

Figure 1:
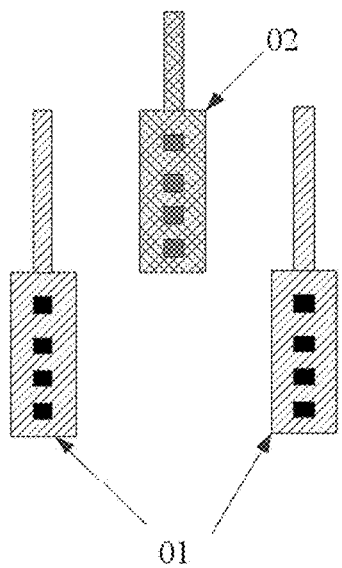
FIG. 1 is a schematic view of a gate layer and an SD layer which have wires thereof alternate with each other known by the inventor.

The technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Embodiment 1

The embodiment of the present disclosure provides a method for manufacturing an array structure. Before the process of forming an SD metal layer on a GI layer, the method further includes: etching the GI layer at a position corresponding to an SD signal access terminal, and forming a through-hole structure in the GI layer.

In the method for manufacturing an array structure, before the process of preparing the SD metal layer, namely in the process of preparing the GI layer, the GI layer at a position corresponding to the SD signal access terminal (namely SD pad) is also subjected to same etching treatment. After etching, the increased height of the SD signal access terminal can be eliminated, and hence the height difference between the conductive films (ITO) in the gate signal access terminal and the SD signal access terminal can be reduced. Thus, the conductive films in the gate signal access terminal and the SD signal access terminal which are connected to adjacent IC pins have a same height, so that the forces applied to conductive balls on the conductive films are more uniform and the conductivity is improved.

For instance, in the embodiment, after the process of etching the GI layer at the position corresponding to the SD signal access terminal (SD Pad), the method further includes: forming a source/drain (SD) metal layer, a passivation (PVX) layer and a conductive film (ITO) in sequence on the gate insulating (GI) layer provided with a through-hole structure.

Moreover, after the process of forming the source/drain (SD) metal layer, the passivation (PVX) layer and the conductive film (ITO), the method provided by the embodiment further includes: etching the source/drain (SD) metal layer at a position corresponding to the through-hole structure in the GI layer, forming the passivation (PVX) layer on the source/drain (SD) metal layer continuously, etching the PVX layer at a position corresponding to the through-hole structure in the SD metal layer, and finally forming the conductive film (ITO) on the PVX layer.

Figure 4:
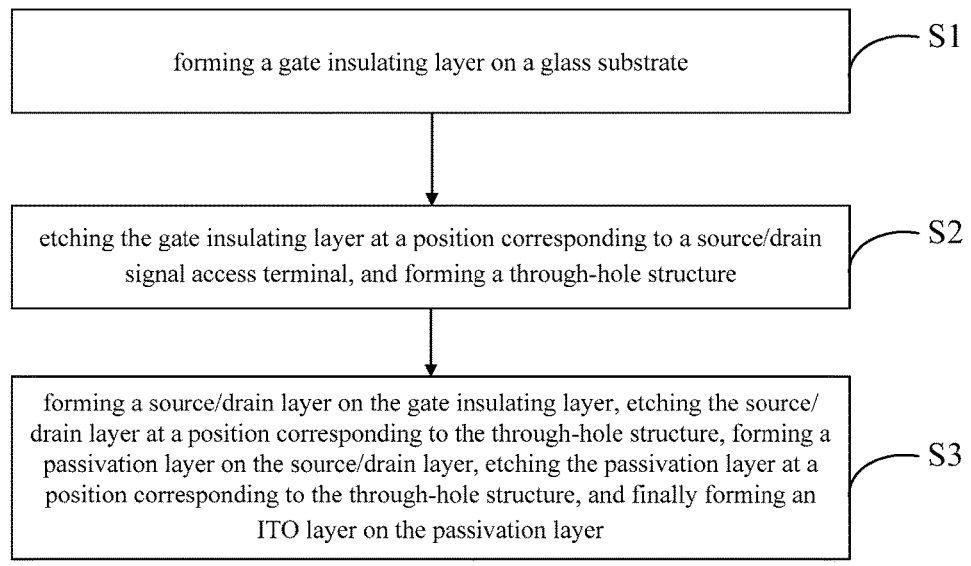
FIG. 4 is a flow chart of a method for manufacturing an array structure, provided by the embodiment 1 of the present disclosure.

FIG. 4 is a schematic flow chart of the method. As illustrated in FIG. 4, the method specifically includes the following steps:

S1: forming a GI layer on a glass substrate;

S2: etching the GI layer at a position corresponding to the SD signal access terminal, and forming a through-hole structure; and S3: forming an SD layer on the GI layer, etching the SD layer at a position corresponding to the through-hole structure, forming a PVX layer on the SD layer, etching the PVX layer at a position corresponding to the through-hole structure, and finally forming an ITO layer on the PVX layer.

Figure 2:
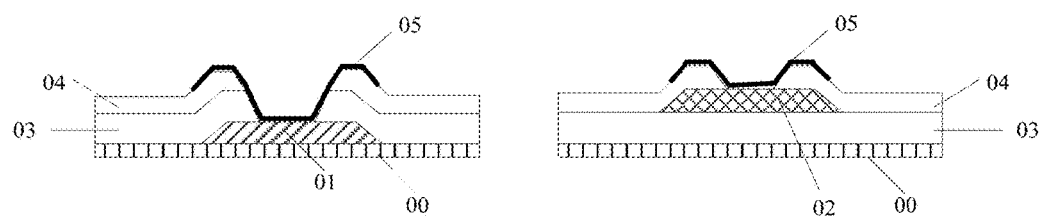
FIG. 2 is sectional views of a gate layer and an SD metal layer which have wires thereof alternate with each other known by the inventor.
Figure 3:
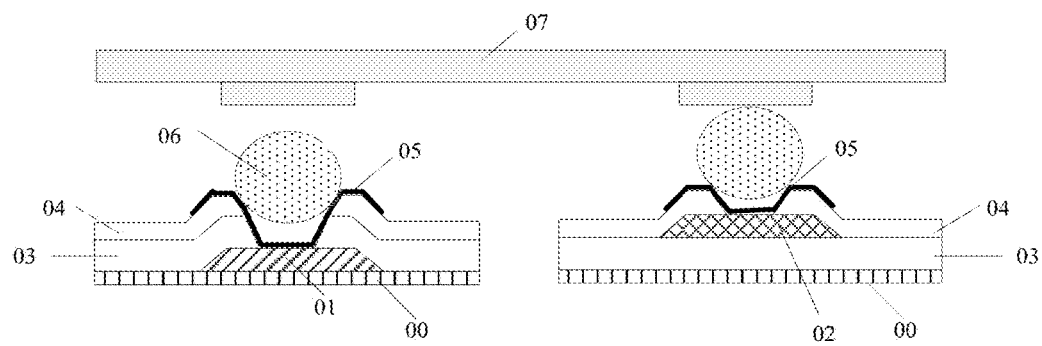
FIG. 3 is sectional views of IC bonding pads of a gate layer and an SD metal layer which have wires thereof alternate with each other known by the inventor.

The above steps are the processing flow of the SD signal access terminal. The processing flow of the gate signal access terminal is as follows: namely as illustrated in FIG. 2, forming a gate layer on a glass substrate 00, forming a gate electrode 01 by etching, forming a GI layer 03 on the gate electrode 01, and etching the GI layer 03 at a position corresponding to the gate electrode 01 to form a through hole; then forming a PVX layer on the GI layer 03 subsequently, and forming a through hole at a position corresponding to the through hole by etching; and finally forming an ITO layer.

In the above method, partial GI layer 03 is etched at the position corresponding to the SD signal access terminal. When the SD metal layer is deposited, the SD metal layer in the SD signal access terminal is closer to the surface of the glass substrate, and hence the effect of increasing the height of the conductive film on the GI layer 03 at the position corresponding to the SD signal access terminal due to the existence of the GI layer 03 can be relieved. Subsequently, the deposition and etching of subsequent layers (namely the SD layer, the PVX layer and the conductive film) are performed, and finally the height of the conductive film in the SD signal access terminal can be reduced. Thus, the height difference between the conductive films in the gate signal access terminal and the SD signal access terminal can be reduced; the space uniformity between IC pins and IC bonding pads can be guaranteed; the forces applied to conductive balls between the IC pins and the IC bonding pads can be more uniform; and hence the conductivity can be improved.

Embodiment 2

Figure 5:
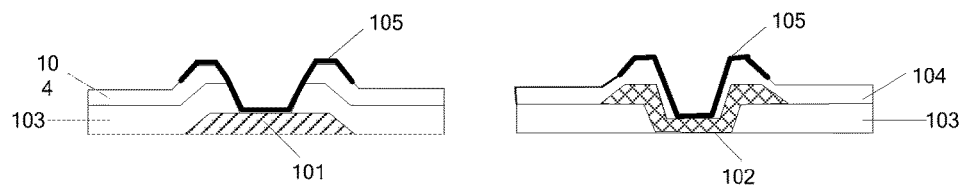
FIG. 5 is a sectional view of an array structure provided by the embodiment 2 of the present disclosure.

The embodiment 2 of the present disclosure further provides an array structure manufactured by the manufacturing method provided by the embodiment 1 of the present disclosure, as illustrated in FIG. 5. The left side of the FIG. 5 and the left side of the FIG. 2 are identical, and both are a sectional view of a gate signal access terminal. The gate signal access terminal in the array structure provided by the embodiment 2 of the present disclosure includes a gate electrode 101, a GI layer 103, a PVX layer 104 and a conductive film 105 formed in sequence. The right side of FIG. 5 is a sectional view of an SD signal access terminal. The SD signal access terminal in the array structure provided by the embodiment 2 of the present disclosure includes a GI layer 103, an SD metal layer 102, a PVX layer 104 and a conductive film 105 formed in sequence; a through-hole structure is formed in the GI layer 103 at a position corresponding to the SD metal layer 102; partial SD metal layer 102 is formed in the through-hole structure; and the through-hole structure is provided with an outward-inclined side wall. Both the SD metal layer 102 and the PVX layer 104 are provided with a concavity including an outward-inclined side wall at a position corresponding to the through-hole structure, namely at a position corresponding to the SD signal access terminal. Thus, the conductive film 105 is provided with a concavity at a position corresponding to the SD signal access terminal.

Figure 6:
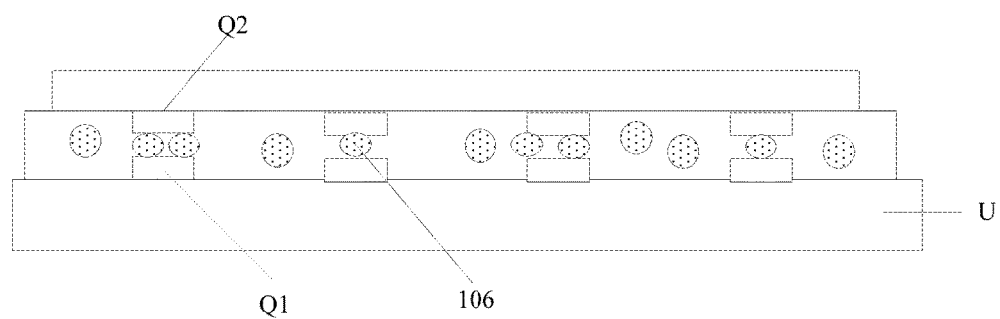
FIG. 6 is a schematic view illustrating that IC pins and IC bonding pads are connected through an ACF in the embodiment 2 of the present disclosure.

FIG. 6 is a sectional view illustrating that a thin-film transistor (TFT) array substrate provided with the above-mentioned array structure and an IC are connected to each other through ACF (anisotropic conductive film). As illustrated in FIG. 6, IC pins Q1 on a TFT substrate U are connected to IC bonding pads Q2 through conductive balls 106 in the anisotropic conductive film.

The embodiment further provides a display device, which includes an array substrate and a color filter substrate. The array substrate is obtained by forming the array structure provided by the embodiment 2 of the present disclosure on a glass substrate.

Figure 7:
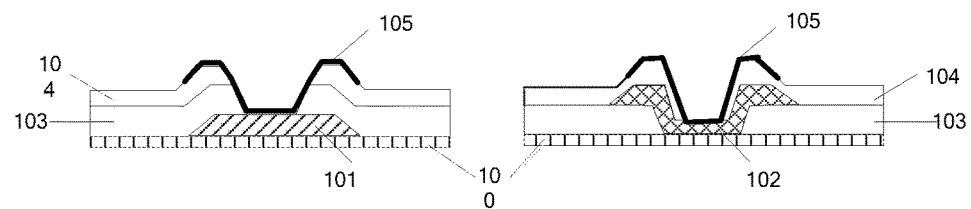
FIG. 7 is a schematic view of an array substrate provided by the embodiment 2 of the present disclosure.

FIG. 7 is a sectional view of the array substrate provided by the embodiment. As illustrated in FIG. 7, the array structure shown in FIG. 5 is formed on a glass substrate 100.

The array substrate provided by the embodiment can achieve the reduction of the height difference between the conductive films in the gate signal access terminal and the SD signal access terminal, guarantee the space uniformity between IC pins and IC bonding pads, guarantee more uniform forces applied to the conductive balls between the IC pins and the IC bonding pads, and hence improve the conductivity.

Embodiment 3

The embodiment 3 of the present disclosure further provides a method for manufacturing an array structure. After the process of forming an SD metal layer (SD layer) on a GI layer, the method further includes: forming a through-hole structure in the SD metal layer at a position corresponding to an SD signal access terminal. Gradual slopes are formed on both sides of the through-hole structure.

In the method, the SD layer is deposited after the GI layer is formed on the glass substrate, and subsequently the SD layer at the position corresponding to the SD signal access terminal is etched. The method can also reduce the height of the conductive film in the SD signal access terminal, reduce the height difference between the conductive films in the gate signal access terminal and the SD signal access terminal, guarantee the space uniformity between the IC pins and the IC bonding pads, guarantee more uniform forces applied to the conductive halls between the IC pins and the IC bonding pads, and hence improve the conductivity.

Figure 8:
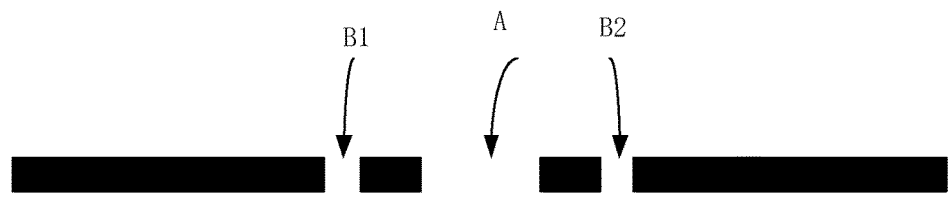
FIG. 8 is a sectional view of a mask applied in the embodiment 3 of the present disclosure.
Figure 10:
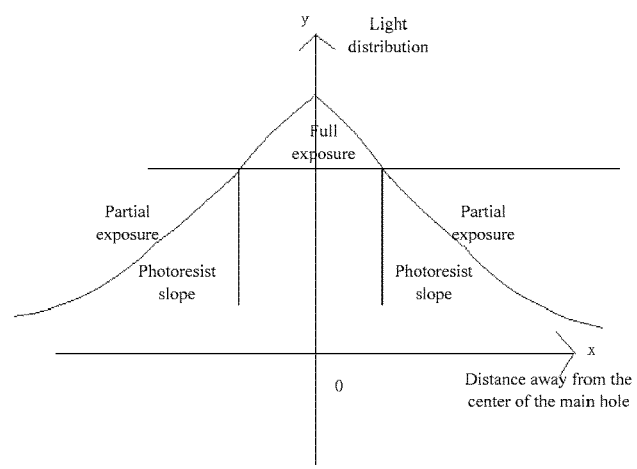
FIG. 10 is a schematic diagram illustrating a light distribution of a mask applied in the embodiment 3 of the present disclosure.

In one example, as illustrated in FIG. 8, in the embodiment, a mask designed for forming the through-hole structure includes a main hole A and compensation holes B1 and B2 formed on both sides of the main hole. A pore diameter of the compensation holes B1 and 132 is smaller than that of the main hole A. In addition, the main hole A is fully-transparent and the compensation holes B1 and B2 are not fully-transparent. The pore diameter of the compensation holes B1 and B2 is usually much smaller than the resolution of an exposure machine. Light capable of running through the compensation holes B1 and B2 on both sides can overlap and enhance the light running through the main hole A in the center. Meanwhile, the light intensity can be gradually reduced from the main hole, as illustrated in FIG. 10.

Figure 9:
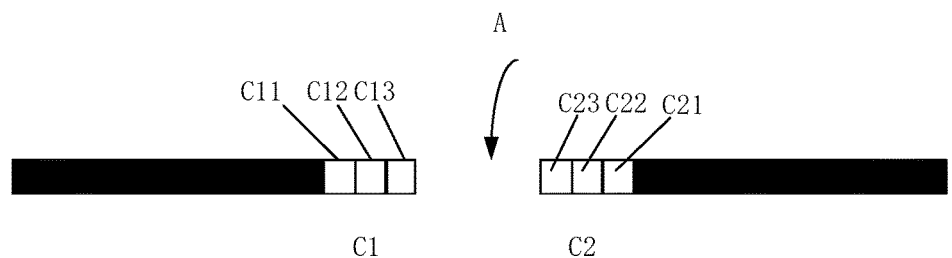
FIG. 9 is a sectional view of a mask applied in the embodiment 3 of the present disclosure.

In another example, as illustrated in FIG. 9, a mask includes a main hole A and half-transparent films C1 and C2 formed on both sides of the main hole A. The main hole A is fully-transparent and the half-transparent films C1 and C2 are not fully-transparent.

For instance, the half-transparent films C1 and C2 include a plurality of second half-transparent films with different transmittances. In the example as shown in FIG. 9, the half-transparent films C1 and C2 include three-level second half-transparent films with different transmittances, namely the half-transparent film C1 includes three second half-transparent films C11 to C13 with different transmittances and the half-transparent film C2 includes three second half-transparent films C21 to C23 with different transmittances. Moreover, the transmittances of the half-transparent films C11 to C13 and C21 to C23 are progressively decreased from the main hole A in the center to both sides, namely the transmittances of C13, C12 and C11 are decreased progressively and the transmittances of C23, C22 and C21 are also decreased progressively. This design of the main hole and the half-transparent films can guarantee that the light intensity can not rapidly reduce from the main hole, but gradually reduce from the main hole to both sides, namely the light intensity reduces gradually, as illustrated in FIG. 10.

Figure 11:
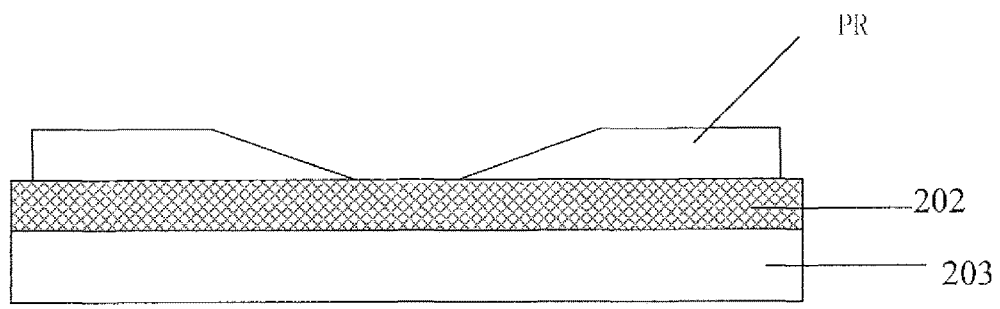
FIGS. 11 to 13 are schematic views illustrating a process of forming a through-hole structure provided with an inclined side wall in an SD layer, in a method for manufacturing an array structure, provided by the embodiment 3 of the present disclosure.
Figure 12:
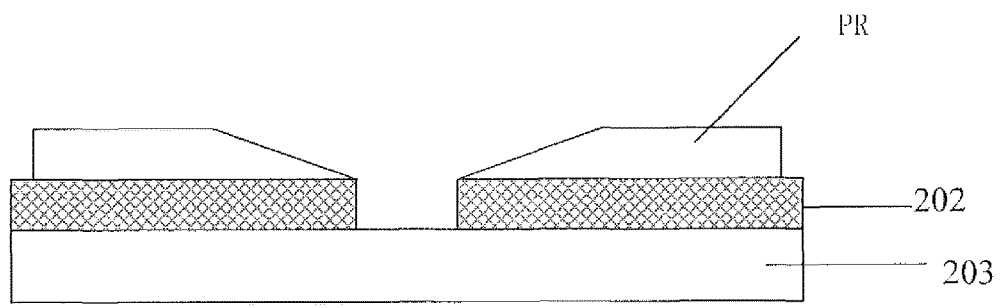
Figure 13:
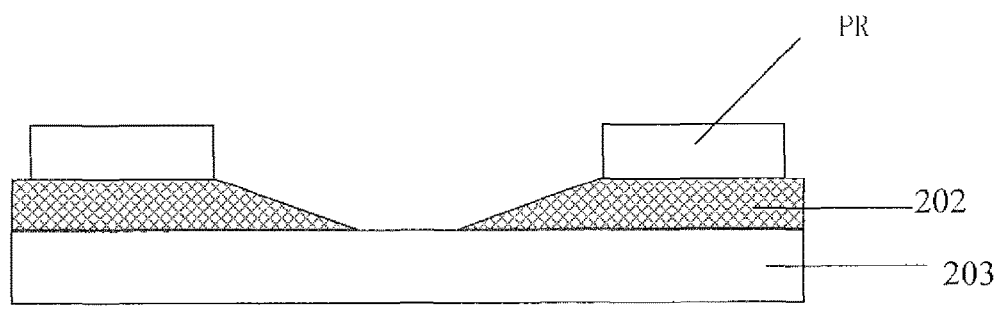

For instance, by adoption of the mask including the main hole and the compensation holes or the main hole and the half-transparent films, the through-hole structure is formed in the SD metal layer at the position corresponding to the SD signal access terminal by photolithography and a wet etching. Gradual slopes are formed on both sides of the through-hole structure. As illustrated in FIG. 11, an SD metal layer 202 is formed on a GI layer 203, and a photoresist PR is formed on the SD metal layer 202. By adoption of the mask as shown in FIGS. 8 and 9 for photolithography, the photoresist PR provided with the slopes is formed on the SD metal layer 202, namely the photoresist PR at a position corresponding to the main hole of the mask is removed and the photoresist PR provided with the slopes is formed on both sides of the position. Subsequently, a wet etching is performed and a through hole is formed in the SD metal layer 202, as illustrated in FIG. 12. Subsequently, a dry etching process is performed to the photoresist PR and the SD metal layer 202. As the photoresist PB on the periphery of the through hole in the SD layer 202 has a slope shape, after the simultaneous dry etching of the photoresist PR and the SD metal layer 202, a side wall of the through hole formed in the SD layer 202 is also provided with a similar gradual slope structure, as illustrated in FIG. 13. As the through hole of the SD metal layer 202 at the position corresponding to the SD signal access terminal is provided with a side wall including a gradual slope, the height of the conductive ball formed on the through hole is reduced; the space uniformity between the IC pin and the IC bonding pad is guaranteed; the contact area between the conductive ball and the conductive film is also increased; the contact area between the conductive film and the SD metal layer is also increased; and hence the conductivity is better.

For instance, after the dry etching process for the SD metal layer, the method further includes: forming a PVX layer on the SD metal layer, forming a through hole with a same inclined side wall in the PVX layer at a position corresponding to the through-hole structure in the SD metal layer, and finally forming a conductive film on the through hole.

Figure 14:
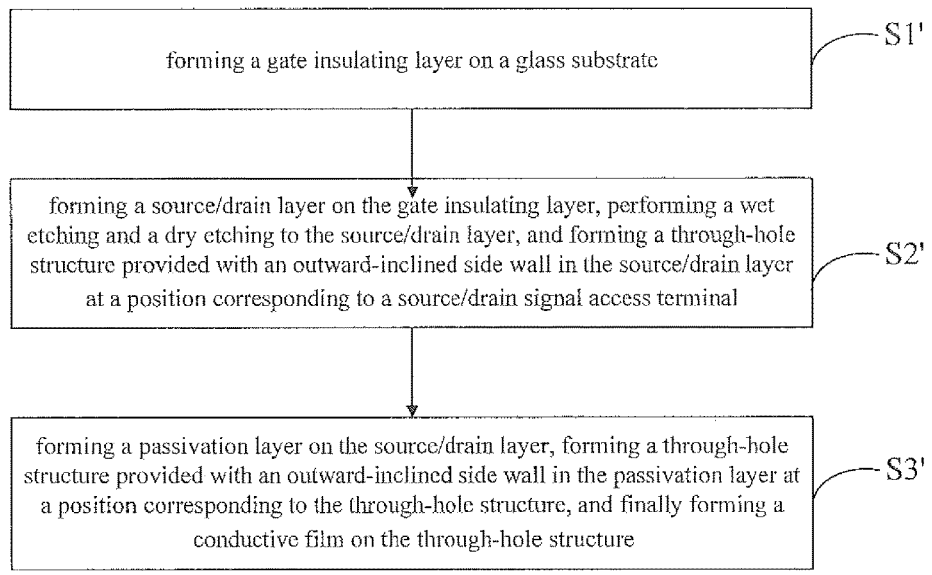
FIG. 14 is a flow chart of the method for manufacturing the array structure, provided by the embodiment 3 of the present disclosure.

FIG. 14 is a flow chart of the method provided by the embodiment. The method specifically includes the following steps.

S1': forming a GI layer on a glass substrate;

S2': forming an SD layer on the GI layer, performing a wet etching and a dry etching on the SD layer, and forming a through-hole structure provided with an outward-inclined side wall at a position corresponding to an SD signal access terminal; and S3': forming a PVX layer on the SD layer, forming a through-hole structure provided with an outward-inclined side wall in the PVX layer at a position corresponding to the through-hole structure, and finally forming a conductive film on the through-hole structure.

The process of processing one side of the gate signal access terminal in the embodiment is the same with that of the embodiment 1. Thus, detailed description will be omitted herein.

In the method, as the through hole in the SD metal layer 202 at the position corresponding to the SD signal access terminal is provided with a side wall including a gradual slope, the height of the conductive ball formed on the through hole is reduced; the space uniformity between the IC pin and the IC bonding pad is guaranteed; the forces applied to the conductive balls between the IC pins and the IC bonding pads are more uniform; and hence the conductivity is improved. Moreover, the contact area between the conductive ball and the conductive film is increased; the contact area between the conductive film and the SD metal layer is also increased; and hence the conductivity is better.

Embodiment 4

Figure 15:
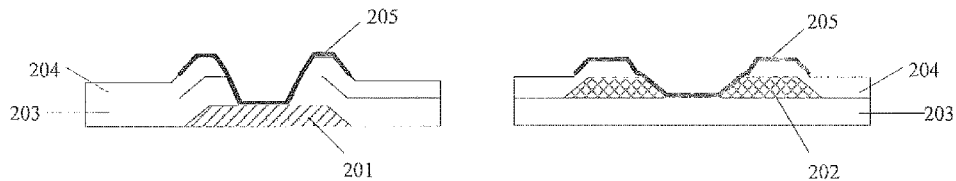
FIG. 15 is a sectional view of an array structure provided by the embodiment 4 of the present disclosure.
Figure 16:
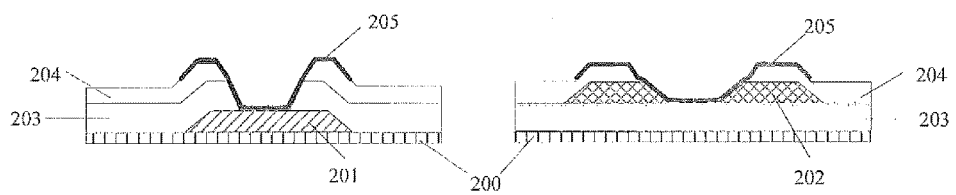
FIG. 16 is a sectional view of an array substrate provided by the embodiment 4 of the present disclosure.

The embodiment 4 of the present disclosure further provides an array structure manufactured by the manufacturing method provided by the embodiment 3 of the present disclosure, as illustrated in FIG. 15. The left side of FIG. 15 and the left sides of FIGS. 2 and 5 are identical, and each is a sectional view of a gate signal access terminal. The gate signal access terminal in the array structure provided by the embodiment 4 of the present disclosure includes a gate electrode 201, a GI layer 203, a PVX layer 204 and a conductive film 205 formed in sequence. The right side of FIG. 15 is a schematic sectional view of an SD signal access terminal. The SD signal access terminal in the array structure provided by the embodiment 4 of the present disclosure includes a GI layer 203, an SD metal layer 202, a PVX layer 204 and a conductive film 205 formed in sequence. A through-hole structure is formed in partial SD metal layer 202.

Moreover, the embodiment further provides a display device, which includes an array substrate and a color filter substrate. The array substrate is obtained by forming the array structure provided by the embodiment 4 of the present disclosure on a glass substrate 200.

The array substrate provided by the embodiment can reduce the height difference between the conductive films in the gate signal access terminal and the SD signal access terminal, guarantee the space uniformity between the IC pins and the IC bonding pads, guarantee more uniform forces applied to the conductive balls between the IC pins and the IC bonding pads, and hence improve the conductivity.

The foregoing embodiments are only intended to illustrate the present disclosure but not intended to limit the present disclosure. Various modifications and variations may also be made by those skilled in the art without departing from the spirit and scope of the present disclosure. Thus, all the equivalent technical solutions should be within the scope of the present disclosure. The scope of the present disclosure shall be defined by the claims.

The application claims priority to the Chinese Patent Application No. 201310571411.1 filed on Nov. 15, 2013. The disclosure content of the Chinese Patent Application is incorporated herein as part of the application.

What is claimed is:

1. A method for manufacturing an array structure, the array structure comprising a gate signal access terminal and a source/drain signal access terminal, wherein the method comprises:

forming a gate insulating layer on a substrate;

forming a source/drain metal layer on the gate insulating layer, etching the source/drain metal layer to form a through-hole structure provided with an outward-inclined side wall in the source/drain metal layer at a position corresponding to the source/drain signal access terminal; and forming a conductive film at a position corresponding to the gate signal access terminal and forming a conductive film at the position corresponding to the source/drain signal access terminal, wherein the etching the source/drain metal layer to form the through-hole structure provided with the outward-inclined side wall in the source/drain metal layer at the position corresponding to the source/drain signal access terminal comprises:

forming a layer of photoresist, provided with an opening, which comprises an inclined side wall and corresponds to the source/drain signal access terminal, on the source/drain metal layer;

performing a wet etching to the source/drain metal layer to form an opening, which comprises a vertical side wall, in the source/drain metal layer at a position corresponding to the opening of the photoresist, wherein the opening, which comprises a vertical side wall, in the source/drain metal layer is aligned with the opening, which comprises the inclined side wall, in the photoresist;

performing a dry etching to both of the photoresist and the source/drain metal layer to form the through-hole structure provided with the outward-inclined side wall in the source/drain metal layer and at the position corresponding to the source/drain signal access terminal, and to remove the inclined side wall of the opening in the photoresist and obtain an opening, which comprises a vertical side wall, in the photoresist, wherein the vertical side wall of the opening in the photoresist is aligned with an upper edge of the outward-inclined side wall of the through-hole structure in the source/drain metal layer; and removing the photoresist.

2. The method for manufacturing an array structure according to claim 1, after removing the photoresist, further comprising: forming a passivation layer on the source/drain metal layer, forming a through-hole structure provided with an outward-inclined side wall in the passivation layer at a position corresponding to the through-hole structure in the source/drain metal layer, and finally forming the conductive film at the position corresponding to the source/drain signal access terminal on the through-hole structure of the passivation layer.

3. The method for manufacturing an array structure according to claim 1, wherein the photoresist provided with the opening, which comprises the inclined side wall and corresponds to the source/drain signal access terminal is formed by a mask comprising a main hole and compensation holes formed on both sides of the main hole; the compensation holes are smaller than the main hole; the main hole is fully-transparent; and the compensation holes are not fully-transparent.

4. The method for manufacturing an array structure according to claim 1, wherein the photoresist provided with the opening, which comprises the inclined side wall and corresponds to the source/drain signal access terminal, is formed by a mask comprising a main hole and half-transparent films formed on both sides of the main hole; the main hole is fully-transparent; and the half-transparent films are not fully-transparent.

5. The method for manufacturing an array structure according to claim 4, wherein each of the half-transparent films includes a plurality of second half-transparent films with different transmittances; and the transmittances of the second half-transparent films are progressively decreased from the main hole as a start and in a direction facing away from the main hole.

6. The method for manufacturing an array structure according to claim 1, wherein the conductive film at the position corresponding to the gate signal access terminal and the conductive film at the position corresponding to the source/drain signal access terminal are respectively connected to adjacent IC pins through conductive balls, and the conductive film at the position corresponding to the gate signal access terminal has a same height as the conductive film at the position corresponding to the source/drain signal access terminal on the substrate.

7. The method for manufacturing an array structure according to claim 1, wherein the conductive film at the position corresponding to the source/drain signal access terminal passes through the through-hole structure provided with the outward-inclined side wall in the source/drain metal layer to directly contact the substrate.

* * * * *